United States Patent [19]
Allan et al.

[11] Patent Number: 6,118,727
[45] Date of Patent: Sep. 12, 2000

[54] SEMICONDUCTOR MEMORY WITH INTERDIGITATED ARRAY HAVING BIT LINE PAIRS ACCESSIBLE FROM EITHER OF TWO SIDES OF THE ARRAY

[75] Inventors: James D. Allan; Iulian C. Gradinariu, both of Colorado Springs, Colo.

[73] Assignee: Cypress Semiconductor Corporation, San Jose, Calif.

[21] Appl. No.: 09/038,552

[22] Filed: Mar. 10, 1998

[51] Int. Cl.[7] ....................................................... G11C 8/10
[52] U.S. Cl. ............................... 365/230.06; 365/230.04; 365/200; 365/63
[58] Field of Search ............................. 365/200, 230.04, 365/230.06, 63, 72

[56] References Cited

U.S. PATENT DOCUMENTS

| | | | |
|---|---|---|---|
| 4,982,372 | 1/1991 | Matsuo | 365/23.03 |
| 5,036,491 | 7/1991 | Yamaguchi | 365/189.07 |
| 5,060,200 | 10/1991 | Miura et al. | 365/230.05 |
| 5,841,687 | 11/1998 | Rees | 365/63 |

OTHER PUBLICATIONS

"A 15ns 16Mb CMOS SRAM with Reduced Voltage Amplitude Data Bus", Masato Matsumiya Shoichiro Kawashima, Makoto Sakata, Toru Miyabo, Toru Koga, Kazuo Itabashi, Kazuhiro Mizutani, Taiji Ema, Kazuhiro Toyoda, Takashi Yabu, Hiroshi Shimada, Noriyuki Suzuki, Masahiko Ookura, ISSCC 92/Session 13/Static RAMS/Paper 13.5, 1992 IEEE International Solid–State Circuits Conference, p. 214–215, 287.

"A 45ns 16Mb DRAM with Triple–Well Structure", Syuso Fujii, Masaki Ogihara, Mitsuru Shimizu, Munehiro Yoshida, Kenji Numata, Takahiko Hara, Shigeyoshi Watanabe, Shizuo Sawada, Tomohisa Mizuno, Junpei Kumagai, Susumu Yoshikawa, Seiji Kaki, Yoshikazu Salto, Hideaki Aochih, Takeshi Hamamoto, Ko–ichi Toita, ISSCC 89/Friday Feb. 17, 1989/East Grand Ballroom, 1989 IEEE International Solid–State Circuits Conference, p. 248–249.

*Primary Examiner*—Andrew Q. Tran
*Attorney, Agent, or Firm*—Wagner, Murabito & Hao LLP

[57] ABSTRACT

A memory device includes a memory array having bit line pair interface connections being made alternatively at each side of the array. Column redundancy bit line pairs may be directed to either side of the array. In addition, bit line loads are placed at both ends of respective bit line pairs to improve speed. Stated differently, the memory device includes a bit line pair accessible from either of two sides of the memory array. The array may be one of a number of blocks within the memory device, while the bit line pair may comprise a redundant column bit line pair. The two sides of the memory array from which the bit line pair is accessible may be opposite sides of the array. In addition, the memory device may also include interdigitated bit line pairs within the memory array. One or more bit line pairs, including the above-mentioned redundant column bit line pair, may have bit line loads (e.g., transistors) at each end.

12 Claims, 6 Drawing Sheets

SEMICONDUCTOR MEMORY WITH INTERDIGITATED ARRAY HAVING BIT LINE PAIRS ACCESSIBLE FROM EITHER OF TWO SIDES OF THE ARRAY

FIELD OF THE INVENTION

The present invention relates to semiconductor memory devices and, in particular, to the interface of bit lines and bit line selection circuitry within such devices.

BACKGROUND

Figure 1:
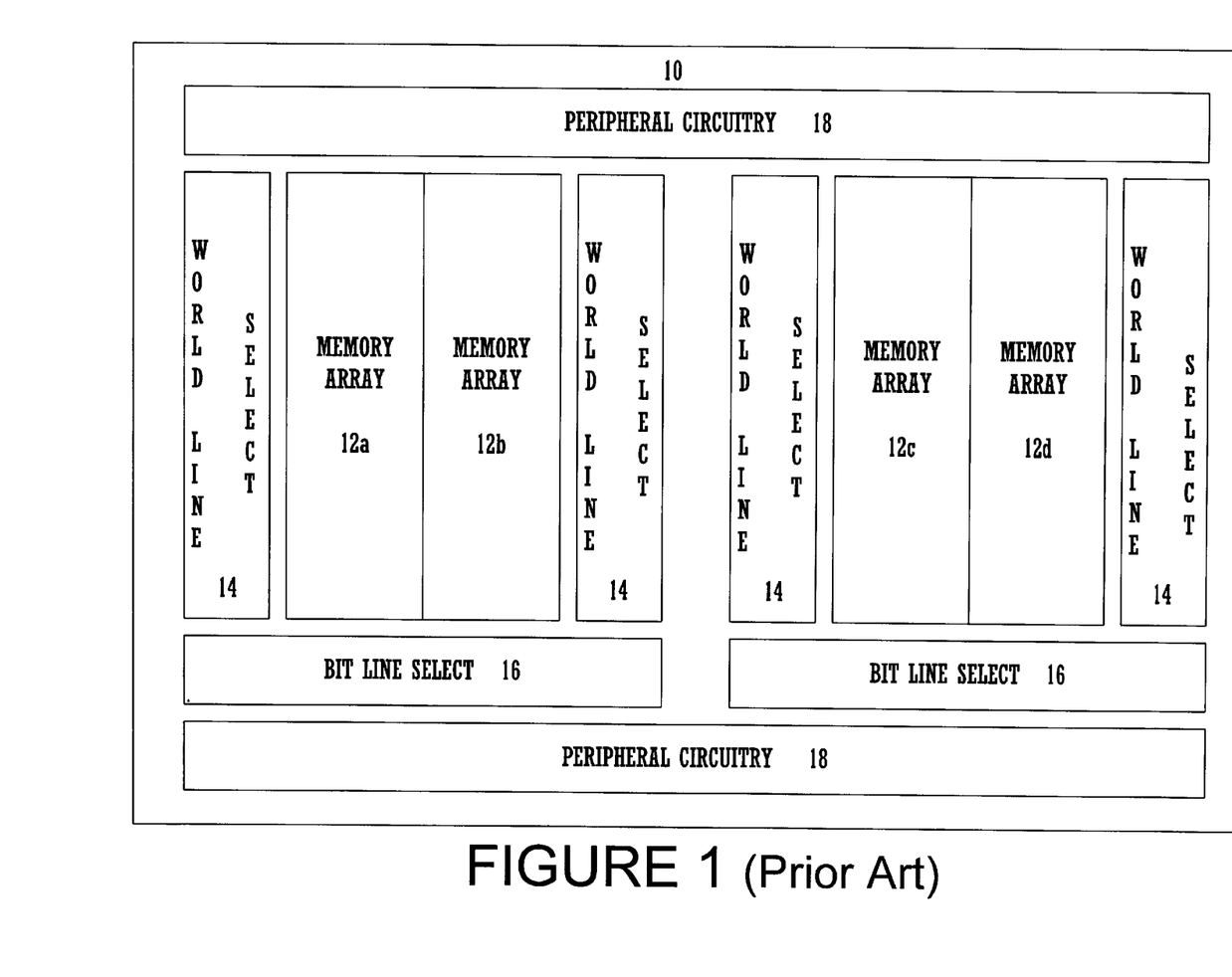
FIG. 1 illustrates a conventional memory device.

Modern semiconductor memory devices, such as memory device 10 shown in FIG. 1, often have arrays of memory cells divided into two or more blocks. For example, conventional memory device 10 is shown with arrays 12a, 12b, 12c and 12d arranged as blocks. The memory device 10 is laid out on a integrated circuit substrate and supporting circuitry such as word line selection circuitry 14, bit line selection circuitry 16 and associated peripheral circuitry 18 is positioned around the memory arrays 12a and 12b. In determining the physical layout of memory device 10 on a substrate, the number of memory array blocks must be considered. In order to increase speed, memory device 10 should be divided into a large number of array blocks so that the bit line and word line components are minimized (i.e., with a large number of array blocks these lines will be shorter, allowing for faster read and write operations). However, from the point of view of reducing die size, a small number of array blocks is preferred.

In addition to the number of array blocks, several other conditions ultimately must be harmonized to determine the final physical layout of any semiconductor memory device. For example, the particular aspect ratio of the semiconductor substrate on which the memory device will be fabricated must be determined. The desire to make the speed of the memory device as fast as possible tends to push the chip aspect ratio, i.e., the ratio of a long edge of the die to a short edge of the die, to be square (i.e., approximately 1:1). This is because having a square aspect ratio will tend to minimize (overall) the length of interconnect structures (such as word lines and bit lines) within the memory device. However, packaging constraints, such as may be imposed by external standards which define the pin spacing and chip cavity size, must also be considered. Often these other constraints will necessitate aspect ratios of approximately 2:1 or 3:1.

In addition to aspect ratio, the pad locations for connection to external pins must be accommodated. Generally, for ease of packaging, bond pads should be placed on all four die edges with equal radial distance between the pads. However, in order to minimize die size, it is sometimes desirable to place the pads on only two opposite sides of the die.

Another important design consideration is keeping the array active current to a minimum. This is usually done by selecting a small number of cells within a block during read or write operations and by selecting only one block at time.

The position of the row and column decoders (shown as word line and bit line selectors 14 and 16 in FIG. 1) is another consideration and often involves a speed/die size trade off. Speed is generally improved when row and column decoders are placed at the center of die, however, die size is generally reduced when row and column decoders are placed at the edge of the die.

Thus, what is needed is a semiconductor memory device architecture that harmonizes each of the above design considerations.

SUMMARY OF THE INVENTION

The present invention provides a memory device which includes a memory array having bit line interface connections being made alternatively at each side of the array. Column redundancy bit line pairs may be directed to either side of the array. In addition, bit line loads are placed at both ends of respective bit line pairs to improve speed.

In one embodiment, the present invention provides a memory device which includes a first bit line pair accessible from either of two sides of a memory array. The bit line pair may comprise a redundant column bit line pair. The two sides of the memory array from which the first bit line pair is accessible may be opposite sides of the array.

The memory device may also include interdigitated bit line pairs within the memory array. Further, a second bit line pair having bit line loads at each end of the bit lines which comprise the second bit line pair may be included. Generally, the bit line loads will be transistors.

In a further embodiment, a memory device includes a first bit line pair having bit line loads at each end of the bit lines which make up the bit line pair. The memory device may be configured such that the first bit line pair is one of a plurality of interdigitating bit line pairs. The bit line loads may be transistors.

BRIEF DESCRIPTION OF THE DRAWINGS

The present invention is illustrated by way of example, and not limitation, in the figures of the accompanying drawings in which.

DETAILED DESCRIPTION

The present invention provides a memory device which includes a memory array having bit line pair interface connections being made alternatively at each side of the array. Column redundancy bit line pairs may be directed to either side of the array. In addition, bit line loads are placed at both ends of respective bit line pairs to improve speed. Stated differently, the memory device includes a bit line pair accessible from either of two sides of the memory array. The array may be one of a number of blocks within the memory device, while the bit line pair may comprise a redundant column bit line pair. The two sides of the memory array from which the bit line pair is accessible may be opposite sides of the array. In addition, the memory device may also include interdigitated bit line pairs within the memory array. One or more bit line pairs, including the above-mentioned redundant column bit line pair, may have bit line loads (e.g., transistors) at each end.

Figure 2:
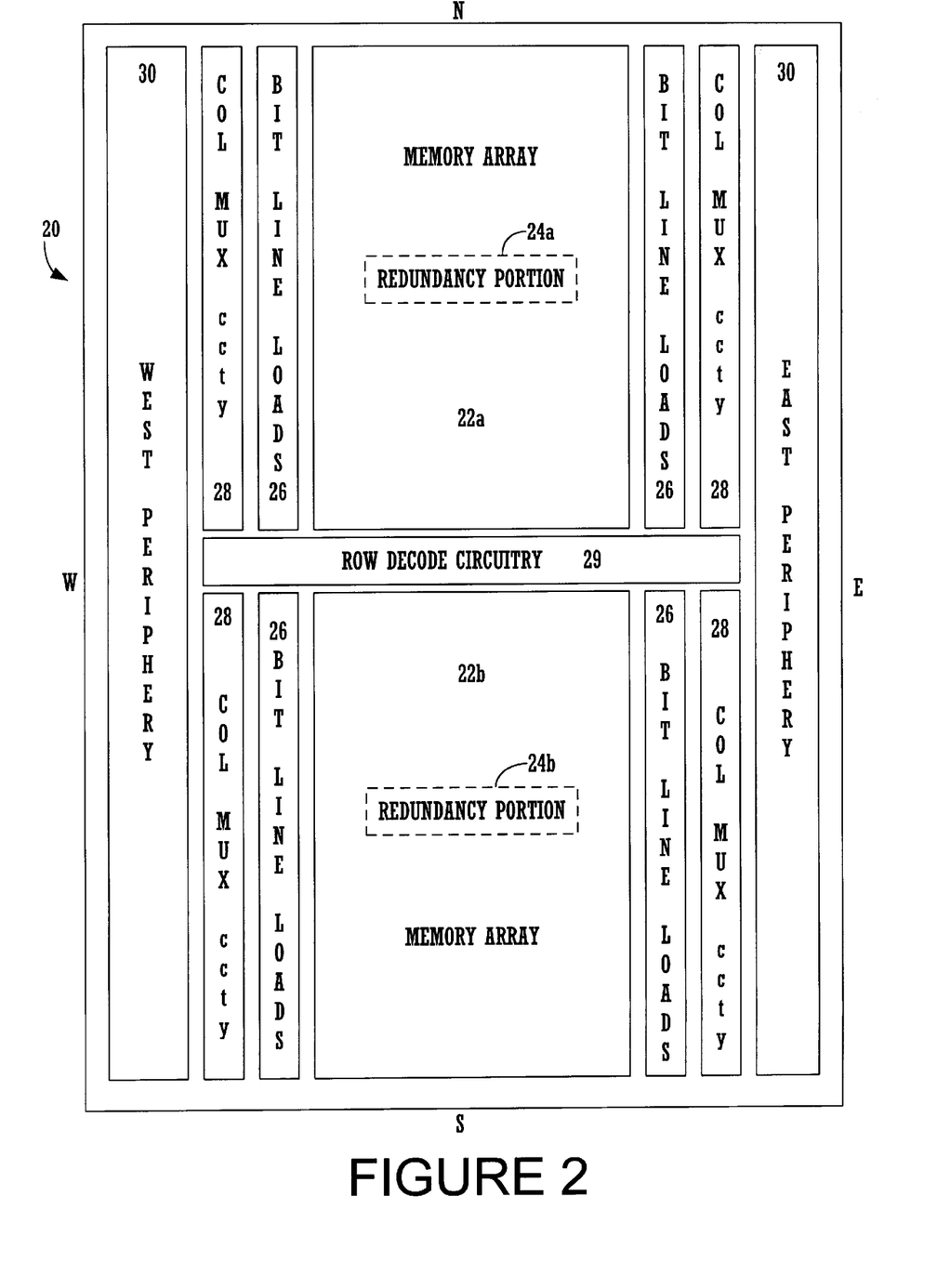
FIG. 2 illustrates a memory device configured in accordance with one embodiment of the present invention.

FIG. 2 illustrates a memory device 20 configured in accordance with one embodiment of the present invention. Memory device 20 is shown in a layout view which illustrates the physical location of various circuitry on a semiconductor substrate (e.g., silicon). In general, memory device 20 will be fabricated on a single die and then packaged using conventional semiconductor fabrication and packaging methods familiar to those of ordinary skill in the art. As shown, memory device 20 is arranged with two memory array blocks 22a and 22b (although fewer or more blocks may be used). Included within memory array blocks 22a and 22b are redundancy portions 24a and 24b, respectively, which provide column redundancy within each array block 22 of memory device 20. Conventional row redundancy may also be provided but has not been shown in order not to unnecessarily obscure the diagram.

The architecture of memory device 20 as shown in FIG. 2 provides a die aspect ratio of approximately 3:1, primarily to allow for compatibility with conventional packaging requirements. Bonding pads may be placed along the two long edges of the die (i.e., the east (E) and west (W) edges) to accommodate a pin-out pattern which will provide pins along the long edges of the chip package. Where other packaging requirements must be met, alternative layouts may be used.

For example, one alternative architecture may have all of the memory cells for the west side input/output pins on the west half of each array block and all the memory cells for the east side input/output pins on the east half of each array block. This choice is less desirable, however, than the architecture of FIG. 2. For example, the alternative choice would require double the number of array blocks, with two blocks being selected during each read or write operation. As a consequence, twice the array active current would be required during these operations than is required for the architecture of FIG. 2. In addition, such an alternative layout would necessitate the use of on-pitch column decoders and on-pitch data transfer circuitry, placed at both array edges. Such on-pitch circuitry tends to be expensive in terms of die area.

As further discussed below in connection with FIG. 3, each memory array block 22a and 22b supports interdigitated bit line pairs. Data is therefore accessed alternatively, from the east and west in each array block. This scheme has the advantage of requiring only a single array block to be selected for a given read or write operation, thus saving on active array current. Also, die area is saved because the column decoder and data transfer circuitry for each bit line pair can now be laid out on a two cell pitch rather than a single cell pitch.

One draw back of an architecture such as shown in FIG. 2 is increased capacitance of the bit lines. This is because the bit lines tend to be long. The higher capacitance may result in slower access times. To help improve speed, bit line loads 26 are placed on each side of a memory array block 22. The functions of these bit lines loads 26 will be discussed further below.

As further shown in FIG. 2, column multiplexer circuitry (e.g., bit line select circuitry) 28 is placed at both sides of each memory array block 22a and 22b to allow for the interdigitated bit lines. Row decode circuitry 29 is shared by array blocks 22a and 22b and, therefore, is placed along a N-S centerline of memory device 20 as shown. Other circuitry required for the operation of memory device 20 (e.g., encoder/decoder circuitry, sense amplifiers, etc.) may be disposed along the east and west peripheries 30 of the chip.

Figure 3:
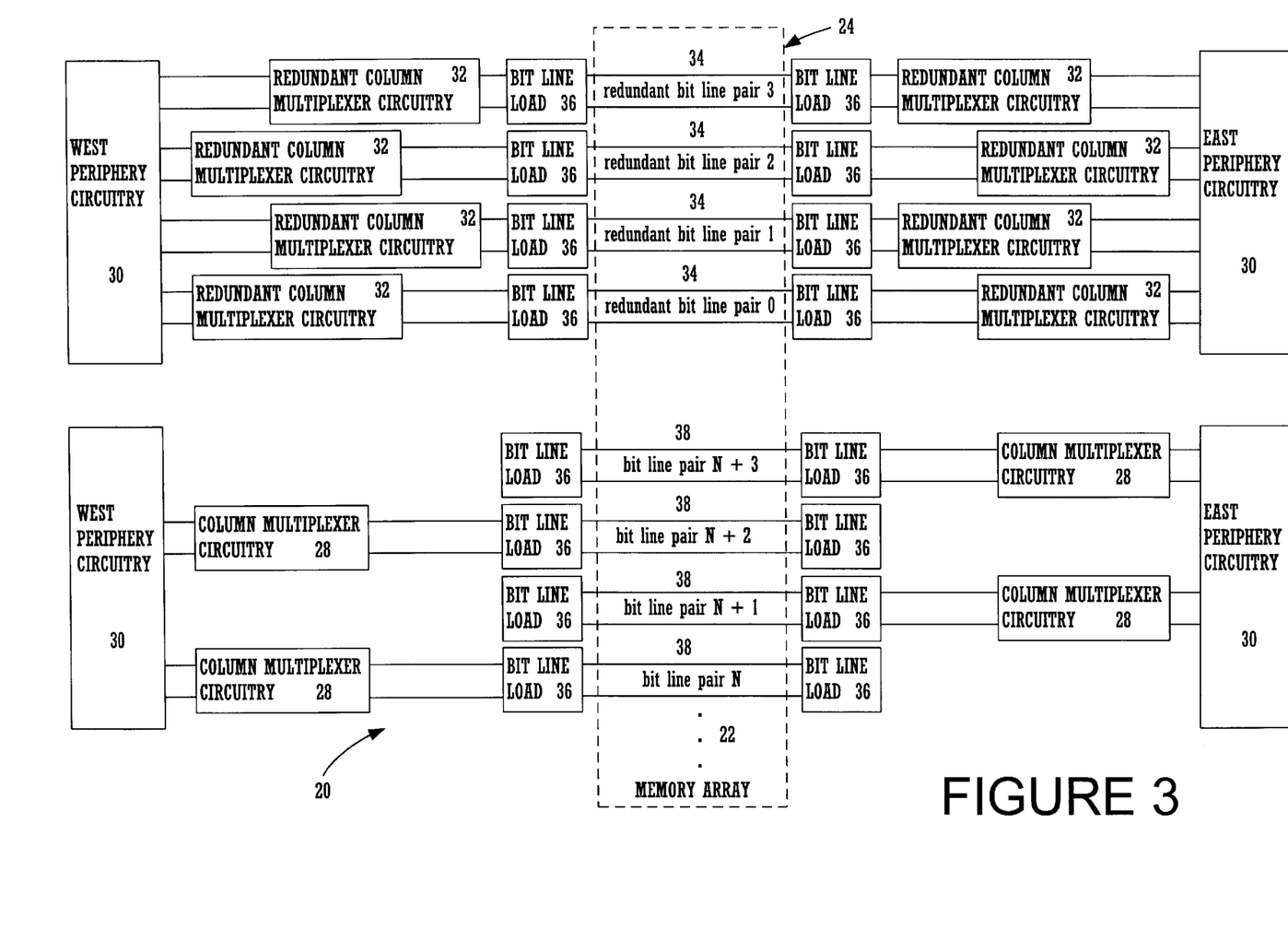
FIG. 3 illustrates a column redundancy bit line scheme and interdigitated bit line scheme for the memory device of FIG. 2.

FIG. 3 shows the interdigitated bit line scheme for a memory array block 22 in further detail. Also shown is a unique column redundancy scheme which allows for bit line pairs associated with redundant columns to be accessed from either the east or the west side of the chip. In general, in the case of column redundancy for a memory organized other than as a ×1 word-format part, it is preferable for spare columns not to be "hard wired" to fixed input/output circuitry, but to be redirectable to any input/output. As shown in FIG. 3, the spare (i.e., redundant) columns have been made redirectable to both the east and west edges of memory device 20 (i.e., circuitry located thereat) by adding redundant column multiplexer circuitry 32 for each redundant bit line pair 34 at both ends thereof. This provides maximum flexibility for column redundancy while minimizing die size.

Another feature shown in FIG. 3 concerns the placement of bit line loads 36 for various bit line pairs within memory array 22. In conventional memories, bit line loads are typically placed at the end of a bit line pair opposite to associated column multiplexer circuitry, thus allowing for easier layout. Alternatively, bit line loads are placed at the same end of a bit line pair as the column multiplexer circuitry, allowing for better performance. However, in either case, the slowest memory bits suffer on access time push-outs because of the associated capacitance between the memory cells and the bit line loads. To overcome such problem, bit line loads 36 of memory device 20 are placed at both ends of each redundant bit line pair 34 and each bit line pair 38. Such a scheme has the effect of reducing the worst case memory cell-to-bit line load "RC" value to approximately ¼the value that would typically be experienced in a scheme of the prior art.

Thus, memory device 20 includes redundant bit line pairs 34 which are accessible from either of two opposite sides of memory array 22 (at least within redundancy portion 24 of memory array 22). Memory device 20 also includes interdigitated bit line pairs 38 within memory array 22. Bit line pairs 38 are said to be interdigitated because the bit line pairs are alternatively selectable by circuitry associated with the east and west sides of memory device 20. Both redundant bit line pairs 34 and bit line pairs 38 include bit line loads 36 at each end of each of the bit lines.

Figure 4:
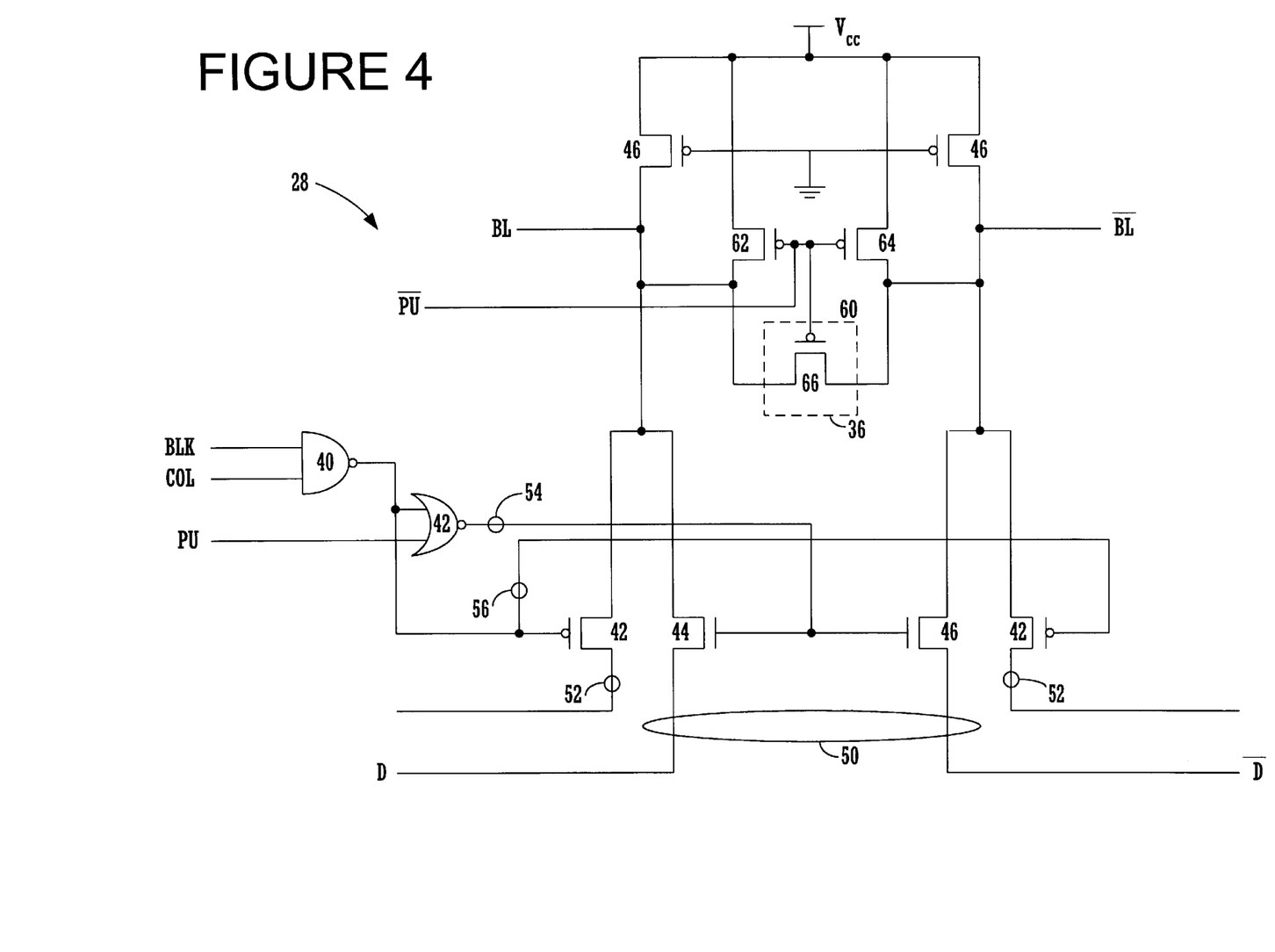
FIG. 4 illustrates a column multiplexer circuit for use with the memory device shown in FIG. 2.

FIG. 4 shows column multiplexer circuitry 28 in more detail. To appreciate the operation of column multiplexer circuitry 28, some reference to the physical layout of memory device 20 is helpful. Memory device 20 includes a data write bus driver (e.g., in the east and/or west periphery 30) which transmits data to be written to selected memory cells of memory device 20 during write cycles along a data write bus 50. The data write bus 50 routes data signals from the periphery of memory device 20 to the memory core, e.g., through a spine. At the memory core (i.e., memory array 22), the data signals are applied to a selected column of memory cells through column multiplexer circuitry 28. Column multiplexer circuitry 28 thus comprises a bit line interface for memory device 20.

In general, data signals from the data write bus 50 are routed through column multiplexer 28 to a pair of bit lines, BL and $\overline{BL}$, for writing to a selected one of the memory cells of array block 22. The individual memory cell to which the data signal is written is selected using a word line (not shown) in the conventional manner. In a similar fashion, column multiplexer circuitry 28 provides for transferring signals from a selected memory cell from bit lines BL and $\overline{BL}$ to a read data bus 52. Read data bus 52 transmits these signals to circuitry in the periphery 30 of memory device 20 (e.g., to sense amplifiers) where they may be amplified to determine the logic value stored by the selected memory cell. In some cases, the data write bus 50 and the read data bus 52 may be the same (at least partially) bus.

Column multiplexer circuitry 28 thus provides circuitry for selecting data paths during read and/or write operations. For example, during write operations, signals D and $\overline{D}$ are provided to column multiplexer circuitry 28 from data write bus 50. One of the signals, D or $\overline{D}$, will be logic low and the other will be logic high, depending on whether a logic 0 or 1 is being written to the selected memory cell. The signals D and $\overline{D}$ are applied to the source terminals of n-channel transistors 44 and 46, respectively, while a write select signal 54 (active high) is applied to the gate terminals of transistors 44 and 46. The write select signal 54 may be generated by select logic, e.g., NAND gate 40 and NOR gate 42, within memory device 20 to select a pair of bit lines, BL and $\overline{BL}$, corresponding to the column of memory cells containing the selected cell the data signal is to be written to. In this way, write select signal 54 couples the data signals from the data write bus 50 to the bit lines BL and $\overline{BL}$. During write operations, a read control signal 56 decouples the read data bus 52 (and the associated sense amplifiers) from the bit lines.

Write select signal 54 may be produced from the logical combination of block and column address signals BLK and COL as shown. In addition, an internal control signal PU (which may define the period of a write operation in memory device 20) may also be used. For the embodiment illustrated in FIG. 4, the block and column address signals are combined (in NAND gate 40) to select the appropriate column and signal PU is used to activate the data write bus-to-bit line interface. Of course, other selection schemes which achieve the same general functionality may be used.

During read operations, signal 56 (active low) is applied to the gates of transistors 42. Transistors 42 act as passgates, essentially coupling bit lines BL and $\overline{BL}$ to read data bus 52. During read operations, signal 54 is kept low, decoupling the data write bus 50 from the bit lines.

Also illustrated in FIG. 4 is bit line pull-up and equalization circuitry. For example, p-channel transistors 46 are coupled between Vcc and bit lines BL and $\overline{BL}$, as shown. The gates of transistors 46 are tied low so that transistors 46 act as static bit line equalization loads, tending to pull bit lines BL and $\overline{BL}$ high. Column multiplexer circuitry 28 also includes dynamic bit line equalization circuit 60. Bit line equalization circuit 60 includes p-channel transistors 62, 64 and 66, each having a gate coupled to receive signal $\overline{PU}$ (active low), the logic complement of signal PU. In response to signal $\overline{PU}$ going low (e.g., at the end of a write operation), transistors 62, 64 and 66 will be switched on, helping to equalize the voltages on bit lines BL and $\overline{BL}$.

Figure 5:
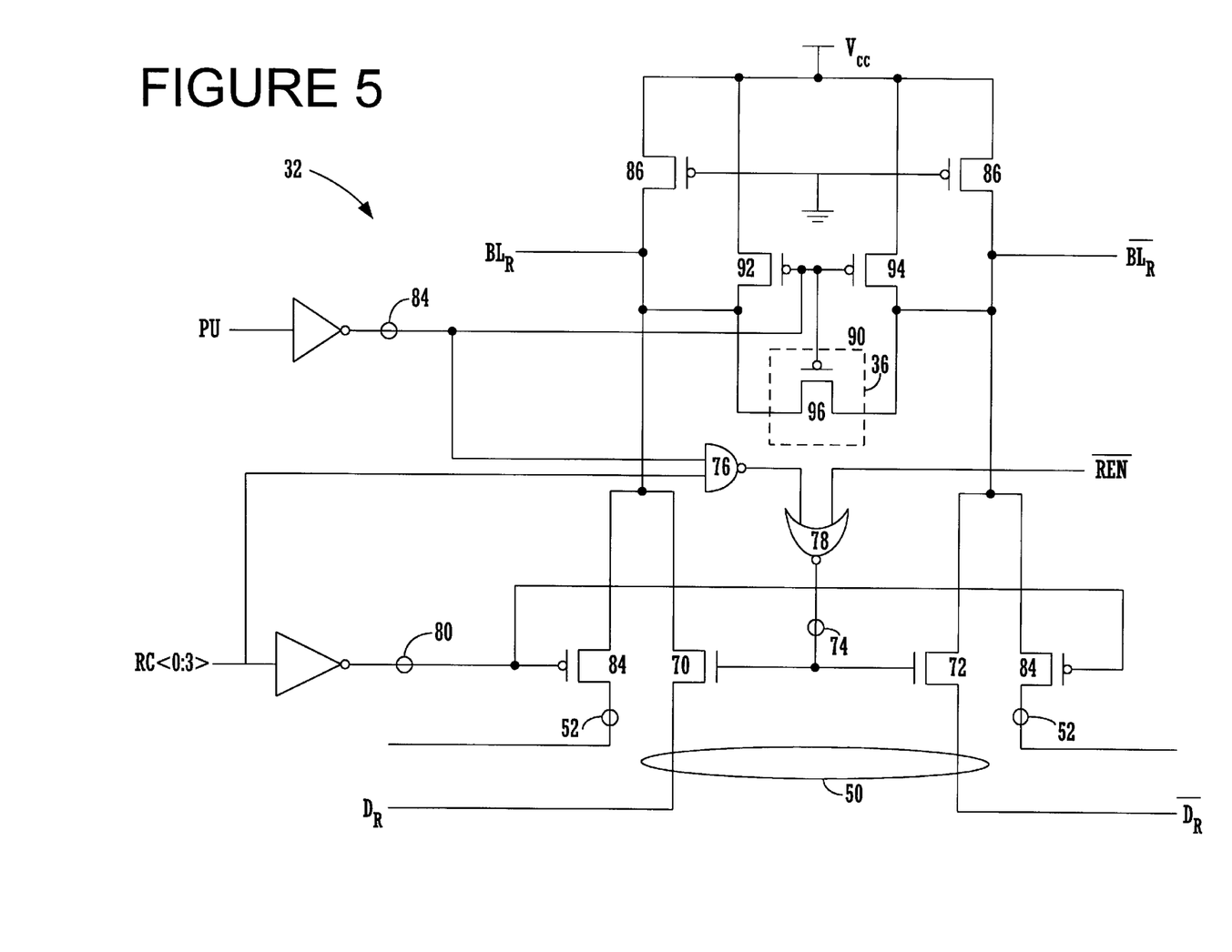
FIG. 5 illustrates a redundant column multiplexer circuit for use with the memory device of FIG. 2.

FIG. 5 shows redundant column multiplexer circuitry 32 in more detail. The operation of this circuitry is similar to that of column multiplexer circuitry 28 shown in FIG. 4. For example, data write bus 50 routes data signals from the periphery of memory device 20 to the redundant column multiplexer circuitry 32. Redundant column multiplexer circuitry 32 thus comprises a redundant bit line interface for memory device 20. In general, data signals from the data write bus 50 are routed through redundant column multiplexer 28 to a pair of redundant bit lines, $BL_R$ and $\overline{BL_R}$, for writing to a selected one of the memory cells of redundancy portion 24 of array block 22. The individual memory cell to which the data signal is written is selected using a word line (not shown) in the conventional manner.

In a similar fashion, redundant column multiplexer circuitry 32 provides for transferring signals from a selected memory cell through redundant bit lines $BL_R$ and $\overline{BL_R}$ to a read data bus 52. Read data bus 52 transmits these signals to circuitry in the periphery 30 of memory device 20 (e.g., to sense amplifiers) where they may be amplified to determine the logic value stored by the selected memory cell. In some cases, the data write bus 50 and the read data bus 52 may be the same (at least partially) bus.

Redundant column multiplexer circuitry 32 thus provides circuitry for selecting data paths during read and/or write operations. For example, during write operations, signals $D_R$ and $\overline{D_R}$ are provided to redundant column multiplexer circuitry 32 from data write bus 50 (which may be the same bus as provides signals D and $\overline{D}$). One of the signals, $D_R$ or $\overline{D_R}$, will be logic low and the other will be logic high, depending on whether a logic 0 or 1 is being written to the selected memory cell. The signals $D_R$ and $\overline{D_R}$ are applied to the source terminals of n-channel transistors 70 and 72, respectively, while a write select signal 74 (active high) is applied to the gate terminals of transistors 70 and 72. The write select signal 74 may be generated by select logic, e.g., NAND gate 76 and NOR gate 78, within memory device 20 to select a pair of redundant bit lines, $BL_R$ and $\overline{BL_R}$, corresponding to the redundant column of memory cells containing the selected cell the data signal is to be written to. In this way, write select signal 74 couples the data signals from the data write bus 50 to the redundant bit lines $BL_R$ and $\overline{BL_R}$. During write operations, a read control signal 80 decouples the read data bus 52 (and the associated sense amplifiers) from the redundant bit lines.

Write select signal 74 may be produced from the logical combination of control signal PU and a redundant column select signal RC, as shown. There are four redundant columns for a memory array block 22, hence, signal RC may be one of four such signals. However, the number of redundant columns may be less than or more than four, depending on the memory density and the maturity of the technology. Control signal PU may, as above, define the period of a write operation in memory device 20. For the embodiment illustrated in FIG. 5, the control signal PU is logically inverted by inverter 82 and the resulting signal 84 along with redundant column select signal RC are provided to NAND gate 76. The output of NAND gate 76 and a further signal $\overline{REN}$ (a redundant column enable signal which may be provided as the result of a fuse selection, for example) are provided to NOR gate 78, the output of which, signal 74, is used to activate the data write bus-to-bit line interface. Of course, other selection schemes which achieve the same general functionality may be used.

During read operations, signal 80 (active low) is applied to the gates of transistors 84. Transistors 84 act as passgates, essentially coupling redundant bit lines $BL_R$ and $\overline{BL_R}$ to read data bus 52. During read operations, signal 74 is kept low, decoupling the data write bus 50 from the redundant bit lines.

Also illustrated in FIG. 5 is bit line pull-up and equalization circuitry similar to that described above. For example, p-channel transistors 86 are coupled between Vcc and redundant bit lines $BL_R$ and $\overline{BL_R}$, as shown. The gates of transistors 86 are tied low so that transistors 86 act as static bit line equalization loads, tending to pull redundant bit lines $BL_R$ and $\overline{BL_R}$ high. Redundant column multiplexer circuitry 32 also includes dynamic bit line equalization circuit 90. Bit line equalization circuit 90 includes p-channel transistors 92, 94 and 96, each having a gate coupled to receive signal 84 (i.e., $\overline{PU}$) (active low), the logic complement of signal PU. In response to signal 84 going low (e.g., at the end of a write operation), transistors 92, 94 and 96 will be switched on, helping to equalize the voltages on redundant bit lines $BL_R$ and $\overline{BL_R}$.

Figure 6:
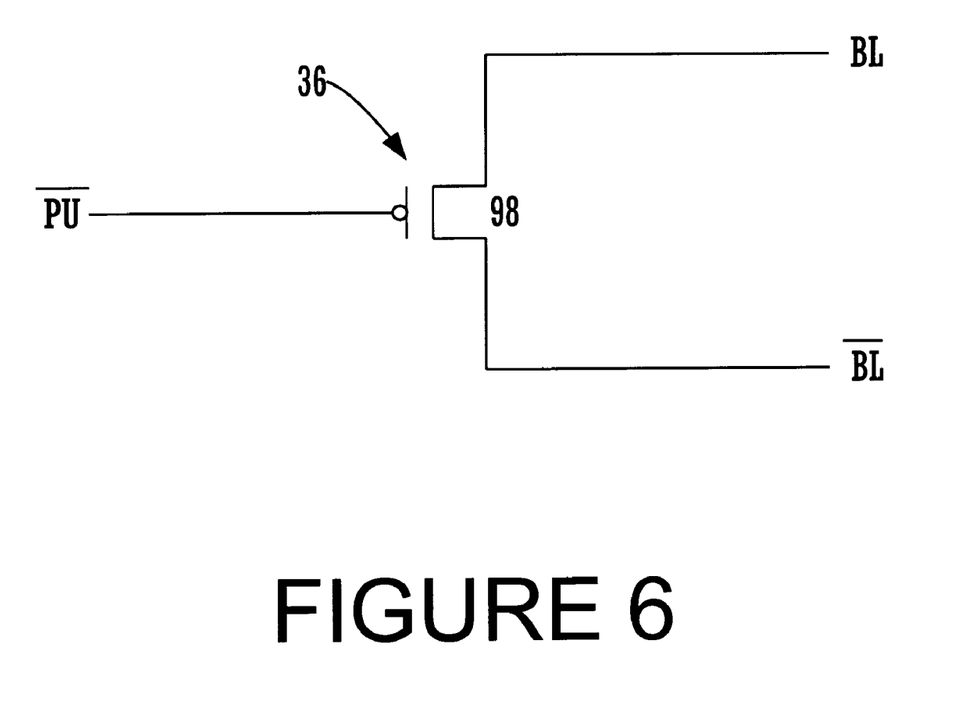
FIG. 6 illustrates a bit line load for use with the memory device of FIG. 2.

FIG. 6 shows a typical bit line load 36, in this case a p-channel transistor 98. It should be appreciated that the function of bit line load transistor 98 is also provided by transistors 66 and 96, as shown in FIGS. 4 and 5, respectively. Transistor 98 is illustrated to show a bit line load 36 for a bit line pair 38 at the ends of the bit lines not associated with column multiplexer circuitry 28. For the redundant bit line pairs 34, because redundant column multiplexer circuitry 32 is present at both ends of a redundant bit line pair, no additional bit line load transistor is required. Bit line load transistor 98 is responsive to signal $\overline{PU}$, as described above.

Thus, a novel semiconductor memory with an interdigitated array has been described. Although discussed with reference to certain illustrated embodiments, it should be appreciated that the present invention may be practiced without some or all of these details. Accordingly, the present invention should only be measured in terms of the claims which follow.

What is claimed is:

1. A memory device, comprising a first bit line pair accessible from either of two sides of a memory array of said memory device.

2. The memory device of claim 1 wherein said first bit line pair comprises a redundant column bit line pair.

3. The memory device of claim 2 wherein said two sides of said memory array are opposite sides of said memory array.

4. The memory device of claim 1 further comprising interdigitated bit line pairs within said memory array.

5. The memory device of claim 4 further comprising a second bit line pair having bit line loads at each end of the bit lines comprising said second bit line pair.

6. The memory device of claim 5 wherein said bit line loads comprise transistors.

7. The memory device of claim 5 wherein said second bit line pair is one of said interdigitated bit line pairs.

8. The memory device of claim 1 further comprising a second bit line pair having bit line loads at each end of the bit line comprising said second bit line pair.

9. The memory device of claim 8 wherein said bit line loads comprise transistors.

10. A memory device, comprising a first bit line pair having bit line loads at each end of the bit lines comprising said first bit line pair.

11. The memory device of claim 10 wherein said first bit line pair comprises one of a plurality of interdigitated bit line pairs.

12. The memory device of claim 11 wherein said bit line loads comprise transistors.

* * * * *

UNITED STATES PATENT AND TRADEMARK OFFICE
CERTIFICATE OF CORRECTION

PATENT NO : 6,118,727
DATED : 9/12/00
INVENTOR(S) : James D. Allan, Iulian C. Gradinariu It is certified that error appears in the above-identified patent and that said Letters Patent are hereby corrected as shown below:

On the title page, item [54] and column 1:
        Title: "SEMICONDUCTOR MEMORY WITH INTERDIGITATED ARRAY"

Signed and Sealed this

Seventeenth Day of April, 2001

*Attest:*

NICHOLAS P. GODICI

*Attesting Officer*    *Acting Director of the United States Patent and Trademark Office*